(12) United States Patent
Yeh et al.

(10) Patent No.: US 11,476,243 B2
(45) Date of Patent: Oct. 18, 2022

(54) FLOATING BASE SILICON CONTROLLED RECTIFIER

(71) Applicant: Amazing Microelectronic Corp., New Taipei (TW)

(72) Inventors: Chih-Ting Yeh, Zhudong Township, Hsinchu County (TW); Che-Hao Chuang, Jhudong Township, Hsinchu County (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 16 days.

(21) Appl. No.: 17/335,744

(22) Filed: Jun. 1, 2021

(65) Prior Publication Data

US 2021/0288044 A1    Sep. 16, 2021

Related U.S. Application Data

(62) Division of application No. 16/101,953, filed on Aug. 13, 2018, now Pat. No. 11,056,481.

(51) Int. Cl.
*H01L 27/02* (2006.01)
*H01L 27/06* (2006.01)

(52) U.S. Cl.
CPC ...... *H01L 27/0262* (2013.01); *H01L 27/0641* (2013.01)

(58) Field of Classification Search
None
See application file for complete search history.

(56) References Cited

U.S. PATENT DOCUMENTS

| 5,502,317 | A  | * | 3/1996  | Duvvury   | H01L 27/0259 |
|           |    |   |         |           | 257/107      |
| 6,172,403 | B1 |   | 1/2001  | Chen      |              |
| 6,501,630 | B1 | * | 12/2002 | Colclaser | H01L 27/0255 |
|           |    |   |         |           | 361/91.1     |

(Continued)

FOREIGN PATENT DOCUMENTS

| TW | 201719849 A | 6/2017 |
| TW | 201822336 A | 6/2018 |

OTHER PUBLICATIONS

Taiwanese Examination Report based on corresponding Application No. 108124993; dated Dec. 23, 2019.

*Primary Examiner* — Aaron J Gray
(74) *Attorney, Agent, or Firm* — Muncy, Geissler, Olds & Lowe, P.C.

(57) ABSTRACT

A floating base silicon controlled rectifier is provided, which at least comprises a first conductivity type layer; a second conductivity type well formed in the first conductivity type layer; a first conductivity type heavily doped region coupled to a first node and formed in the second conductivity type well; and a second conductivity type heavily doped region coupled to a second node and formed in the first conductivity type layer. The first conductivity type and the second conductivity type are opposite. When the first conductivity type is N type, the second conductivity type is P type. Alternatively, when the first conductivity type is P type, the second conductivity type is N type. By employing the proposed present invention, the floating base silicon controlled rectifier acts as a forward diode, and an input capacitance can be greatly reduced.

4 Claims, 15 Drawing Sheets

(56) References Cited

U.S. PATENT DOCUMENTS

| | | | |
|---|---|---|---|
| 6,762,439 B1* | 7/2004 | Chen | H01L 27/0262 |
| | | | 257/E29.225 |
| 7,834,378 B2 | 11/2010 | Ryu | |
| 9,130,010 B2 | 9/2015 | Lai | |
| 11,056,481 B2* | 7/2021 | Yeh | H01L 27/0262 |
| 2003/0102485 A1* | 6/2003 | Chen | H01L 29/87 |
| | | | 257/119 |
| 2013/0114173 A1* | 5/2013 | Chen | H01L 27/0255 |
| | | | 361/56 |
| 2013/0234209 A1 | 9/2013 | Parthasarathy et al. | |
| 2015/0228770 A1* | 8/2015 | Lin | H01L 29/0692 |
| | | | 257/173 |
| 2015/0236011 A1* | 8/2015 | Wang | H01L 29/87 |
| | | | 257/173 |
| 2016/0268447 A1* | 9/2016 | Ritter | H01L 29/87 |

* cited by examiner

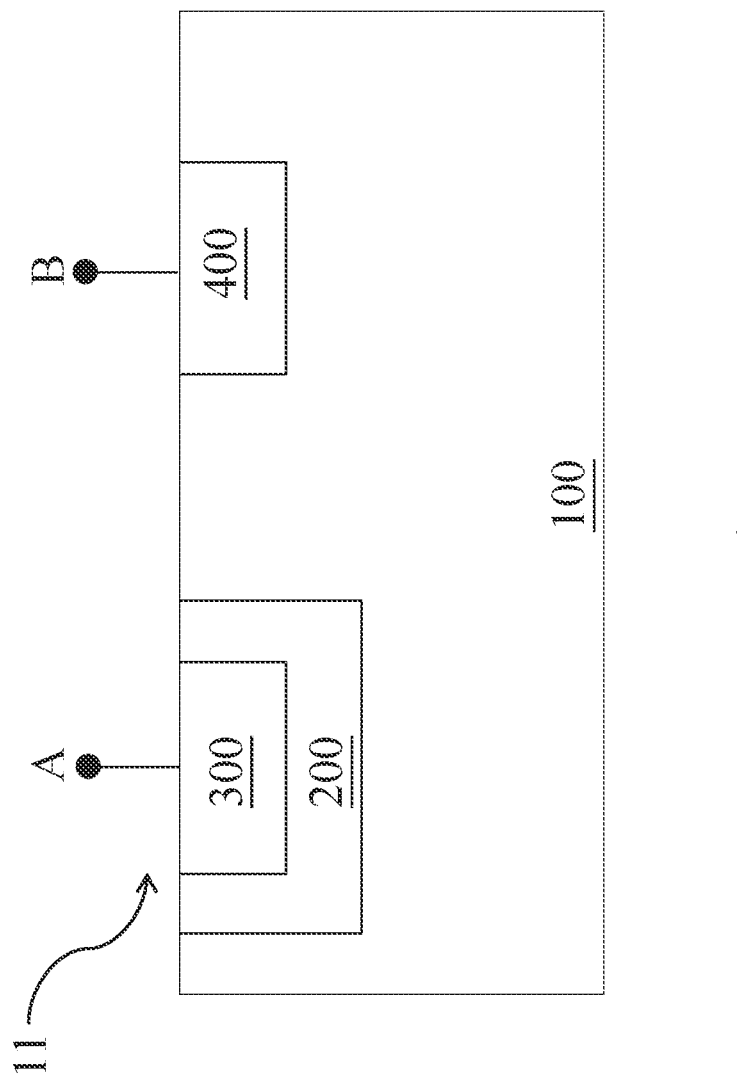

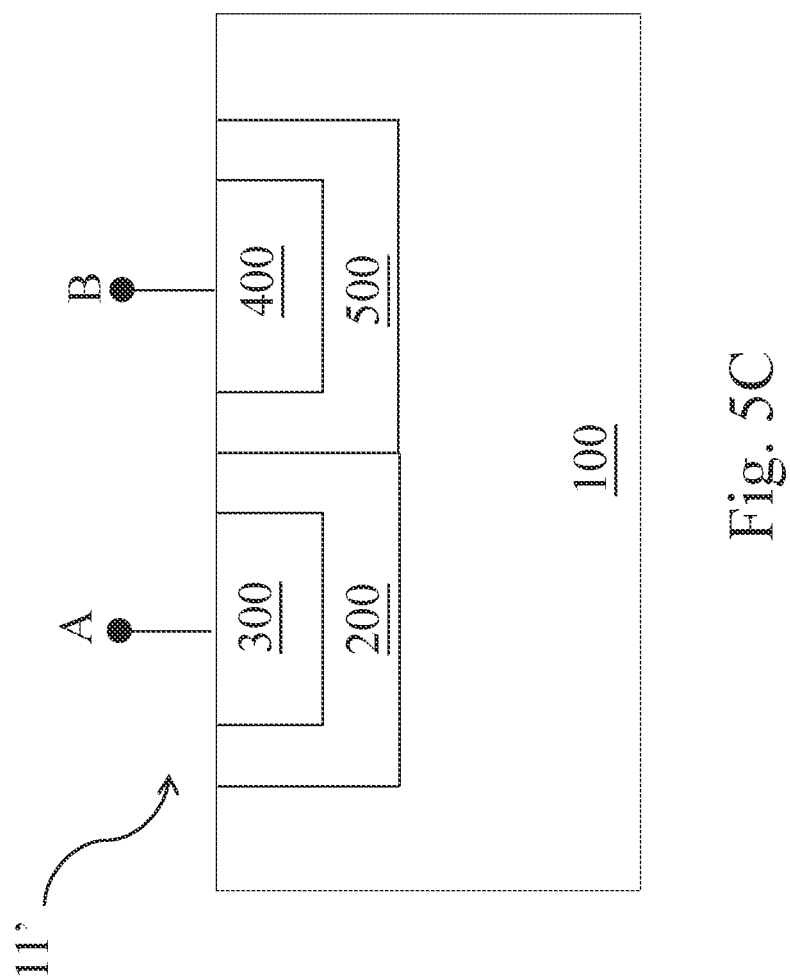

FLOATING BASE SILICON CONTROLLED RECTIFIER

CROSS REFERENCE TO RELATED APPLICATIONS

This application is a Divisional Application of co-pending application Ser. No. 16/101,953, filed on Aug. 13, 2018, for which priority is claimed under 35 U.S.C. § 120, the entire contents of all of which are hereby incorporated by reference.

BACKGROUND OF THE INVENTION

Field of the Invention

The present invention relates to a silicon controlled rectifier, and more particularly to a floating base silicon controlled rectifier.

Description of the Prior Art

With rapid development of today's technology, integrated circuits have been widely applied in electronic devices. However, electrostatic discharge, ESD hereinafter, may occur everywhere during the phases of testing, assembly, installation, operation, etc., and cause damage to integrated circuits (ICs). FIG. 1A shows a conventional ESD protection to a core circuit. As shown in FIG. 1A, ESD (ElectroStatic Discharge) protector 12 is one of the major necessities in the field of integrated circuits for preventing the device to be protected 24 from an ESD event, and has been well known by person skilled in the art. The device to be protected 24 such as core circuits, are prone to damages caused by the ESD event.

Conventionally, a variety of silicon controlled rectifiers (SCRs) have been disclosed so far as ESD protection circuits for shunting ESD stress. For example, U.S. Pat. No. 6,172,403 disclosed an electrostatic discharge protection circuit triggered by a transistor having a floating base. U.S. Pat. No. 7,834,378 disclosed a SCR controlled by the power bias, and U.S. Pat. No. 9,130,010 disclosed latch-up robust SCR-based devices. These disclosures are aimed to address and solve problems of latch-up in a SCR ESD protection device attendant upon an ESD event.

However, it is worth noticing that in all of these disclosures, the discharging path for ESD protection is directly from I/O pin to $V_{ss}$. Moreover, regarding these silicon controlled rectifier structures, a base of the SCR is usually picked up to a certain voltage level, e.g. $V_{ss}$ such that no floating base thereof is formed. As a result, the conventional latch up issues occurring in CMOS ICs cannot be effectively eliminated as expected, and an input capacitance is dramatically high.

Therefore, on account of above, to overcome the above-mentioned problem, it should be obvious that there is indeed an urgent need for the professionals in the field for a new silicon controlled rectifier structure to be developed that can effectively solve those above mentioned problems occurring in the prior design.

SUMMARY OF THE INVENTION

In order to overcome the above-mentioned disadvantages, one major objective in accordance with the present invention is provided for a novel floating base silicon controlled rectifier. By employing the floating base silicon controlled rectifier of the present invention, it can be utilized for a whole-chip ESD protection design with efficient $V_{DD}$-to-$V_{ss}$ ESD clamp circuit for submicron CMOS VLSI technology as well as reducing input capacitances.

For achieving the above mentioned objectives, the present invention provides a floating base silicon controlled rectifier, which comprises a first conductivity type layer; a second conductivity type well formed in the first conductivity type layer; a first conductivity type heavily doped region formed in the second conductivity type well and coupled to a first node; and a second conductivity type heavily doped region formed in the first conductivity type layer and coupled to a second node.

According to the embodiment of the present invention, the first conductivity type and the second conductivity type are opposite. When the first conductivity type is P type, the second conductivity type is N type. In one embodiment, the first conductivity type layer can be a P type substrate. In an alternative embodiment, the first conductivity type layer can be a P type epitaxial layer as well, and the P type epitaxial layer is further formed on a N type heavily doped substrate.

In another embodiment of the present invention, when the first conductivity type is N type, then the second conductivity type will be P type. In one embodiment, the first conductivity type layer can be an N type substrate. In an alternative embodiment, the first conductivity type layer can be an N type epitaxial layer as well, and the N type epitaxial layer is further formed on a P type heavily doped substrate.

Furthermore, a first conductivity type well can be further formed in the first conductivity type layer and the second conductivity type heavily doped region is configured in the first conductivity type well. Under such embodiment, the conductivity type layer can be either a P type or an N type.

In another aspect, the silicon controlled rectifier of the present invention can be further utilized and applied to a whole-chip ESD protection design with efficient $V_{DD}$-to-$V_{ss}$ ESD clamp circuit for submicron CMOS VLSI technology. According to any one of the embodiments of the present invention, a lateral diode structure applicable to whole-chip ESD protection design which comprises at least two diodes $D_p$, $D_n$ connected in series, and the silicon controlled rectifier of the present invention used for replacing any one of the diodes or both of them at the same time are applicable.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 4 shows a block diagram of a floating base silicon controlled rectifier in accordance with an embodiment of the present invention.

FIG. 5C shows a third preferable embodiment of the floating base silicon controlled rectifier according to the present invention.

DESCRIPTION OF THE PREFERRED EMBODIMENTS

Figure 1A:
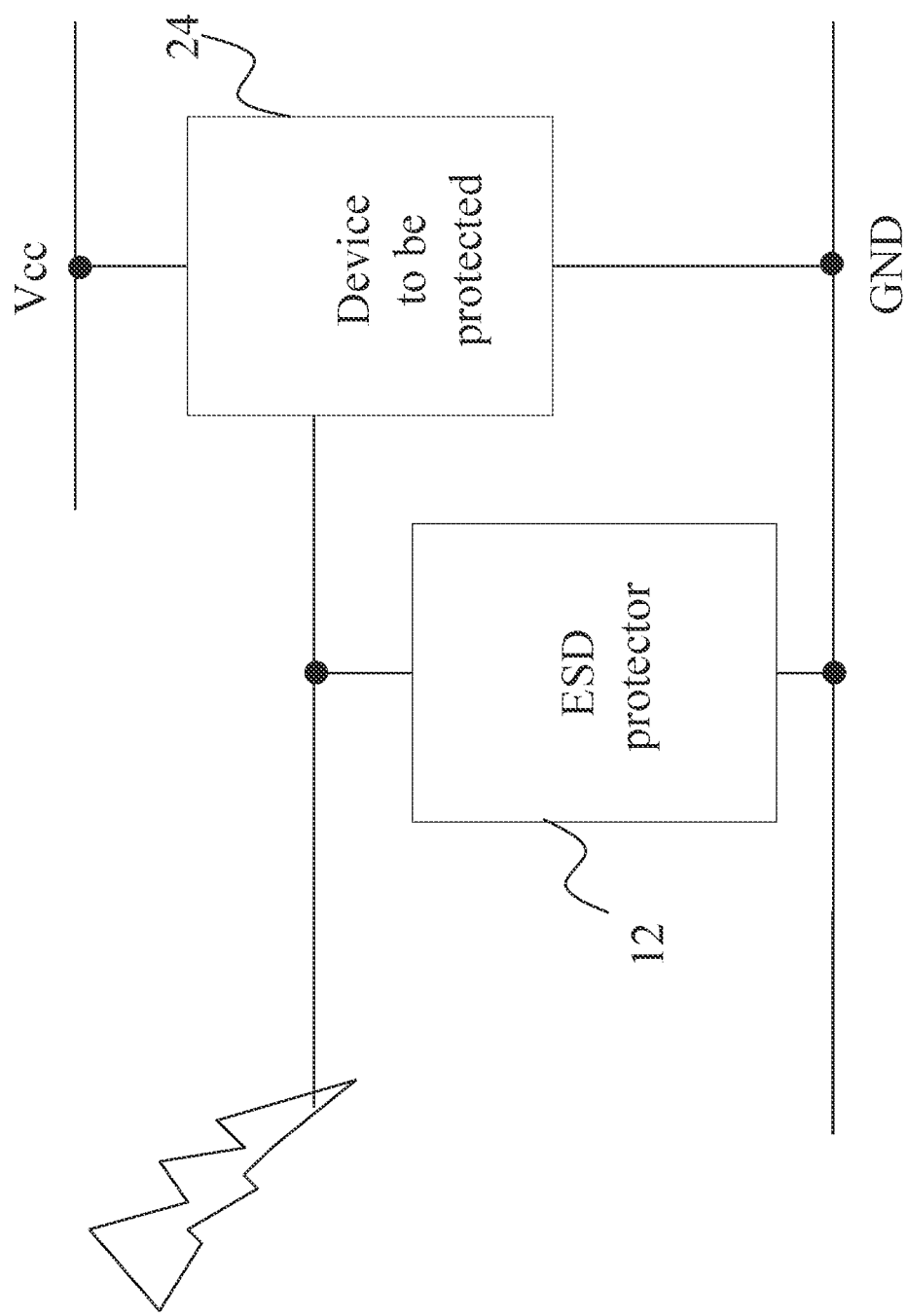
FIG. 1A shows a conventional system level ESD protection scheme in a prior art.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

The present invention discloses a floating base silicon controlled rectifier which can be utilized for a whole-chip ESD (ElectroStatic Discharge, ESD) protection design with efficient $V_{DD}$-to-$V_{ss}$ ESD clamp circuit for submicron CMOS VLSI technology.

Figure 1B:
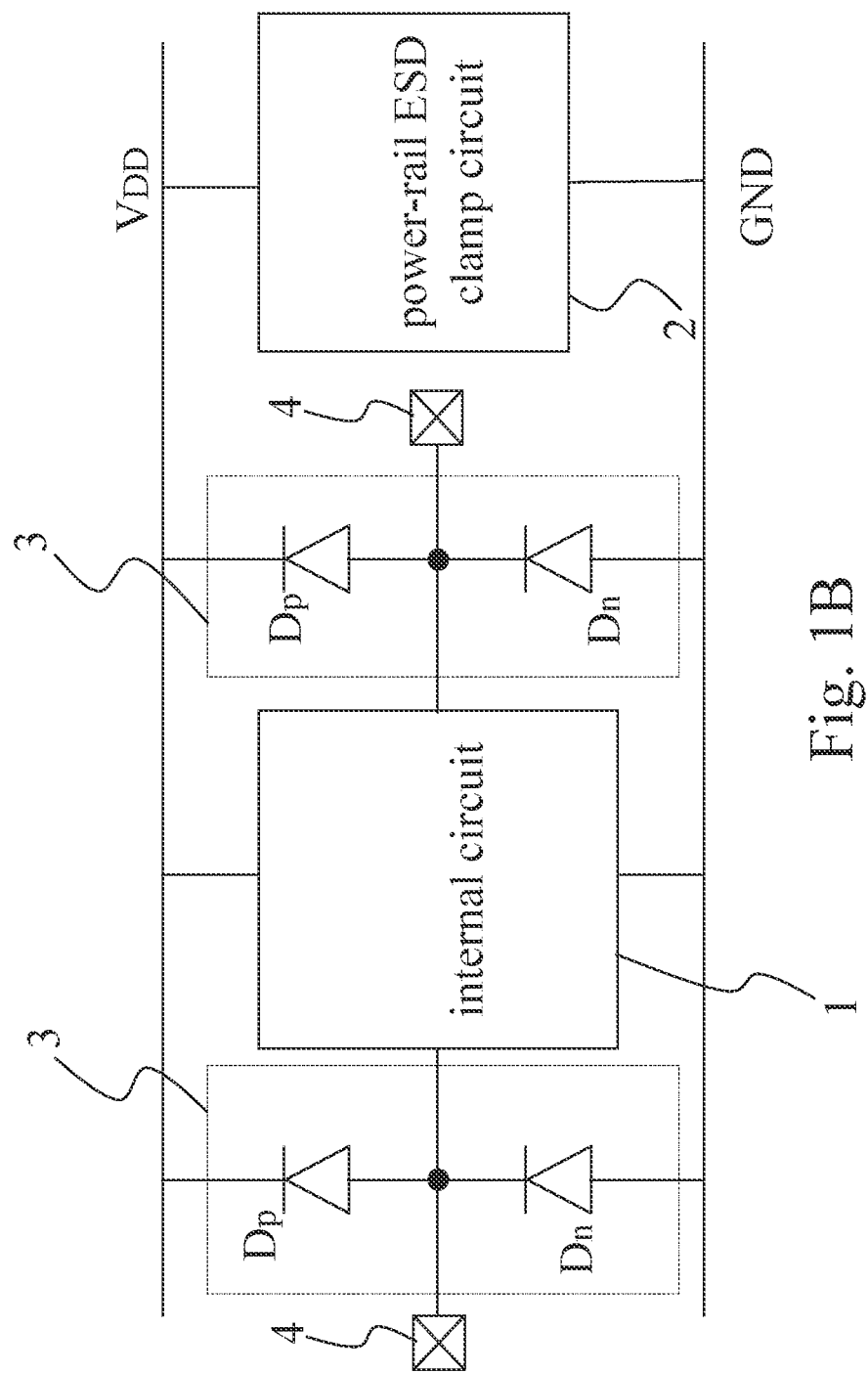
FIG. 1B shows a block diagram of a whole-chip ESD protection design with efficient ESD clamp circuit in accordance with an embodiment of the present invention.

Please refer to FIG. 1B first, which shows a block diagram of a whole-chip ESD protection design with efficient ESD clamp circuit in accordance with an embodiment of the present invention. As shown in FIG. 1B, an internal circuit 1, as a core circuit is electrically coupled between a high voltage level $V_{DD}$ and ground GND. A power-rail ESD clamp circuit 2 is electrically connected in parallel with the internal circuit 1, and two lateral diode structures 3 are coupled between the high voltage level $V_{DD}$ and ground GND as well and in parallel with both the internal circuit 1 and the power-rail ESD clamp circuit 2 for ESD protection. According to the embodiment of the present invention, the lateral diode structure 3 comprises at least two diodes $D_p$, $D_n$ connected in series, and a I/O pin 4 is coupled to a terminal where the two diodes $D_p$, $D_n$ are connected for inputting and outputting signals.

Figure 2:
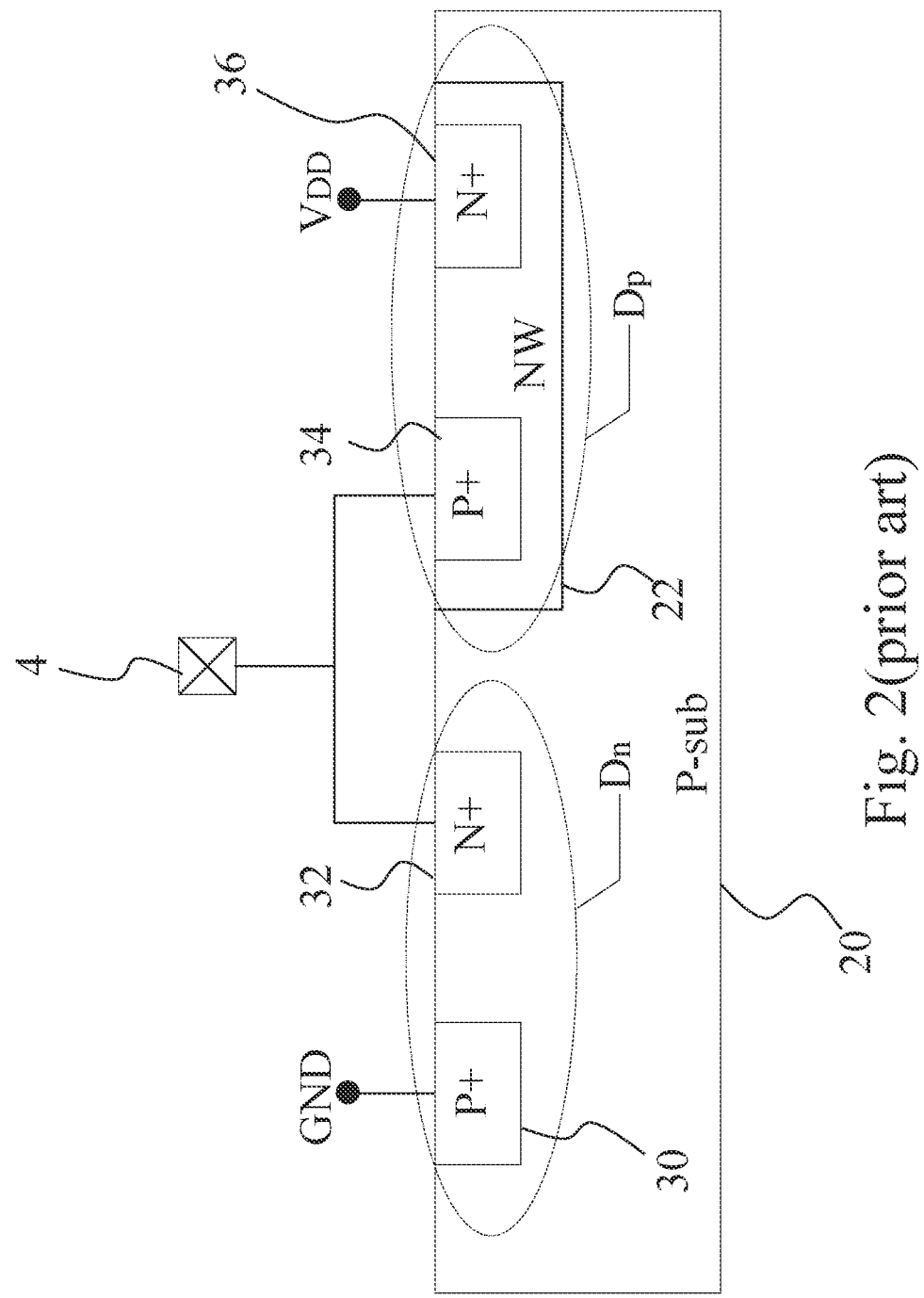
FIG. 2 shows a detailed illustration of the lateral diode structures as shown in FIG. 1B in a conventional design.
Figure 3:
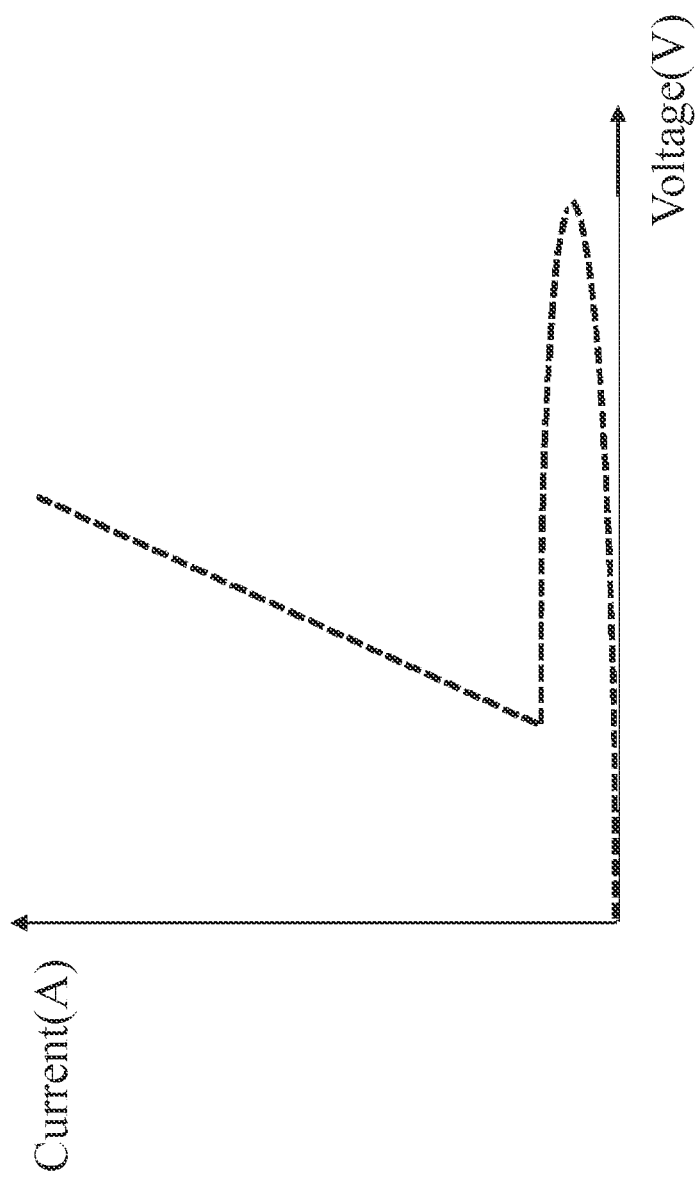
FIG. 3 shows an I-V curve of a traditional silicon controlled rectifier.

FIG. 2 shows a detailed illustration of the lateral diode structures as shown in FIG. 1B in a conventional design. As shown in FIG. 2, a P type substrate 20 is provided with an N type well 22 disposed therein. A P type heavily doped region 30 and a N type heavily doped region 32 are configured in the P type substrate 20 and each of the P type heavily doped region 30 and the N type heavily doped region 32 is coupled to ground GND and the I/O pin 4, respectively. Another P type heavily doped region 34 and N type heavily doped region 36 are configured in the N type well 22 and each of the P type heavily doped region 34 and the N type heavily doped region 36 is coupled to the I/O pin 4 and a high voltage level $V_{DD}$, respectively. According to the scheme structure, the P type heavily doped region 30, the P type substrate 20 and the N type heavily doped region 32 form the diode $D_n$. And, the P type heavily doped region 34, the N type well 22, the P type substrate 20 and the N type heavily doped region 36 form the diode $D_p$. Referring to FIG. 1B and FIG. 2, it is apparent that when a positive impulse is injected through the I/O pin 4, a discharging path composed of the diode $D_p$ and the power-rail ESD clamp circuit 2 is developed for energy dissipating as an ESD protection. However, since the scheme structure as shown in FIG. 2 encounters problems with high junction capacitance, and behaves an I-V curve of a traditional silicon controlled rectifier as shown in FIG. 3 when the traditional SCR is placed between the I/O pin 4 and ground GND. The present invention is aimed to solve these above mentioned problems and proposes a novel floating base silicon controlled rectifier so as to modify the scheme structure as shown in FIG. 2 as well as to perform low capacitance as one major objective of the present invention.

FIG. 4 shows a block diagram of a floating base silicon controlled rectifier in accordance with an embodiment of the present invention. As shown in FIG. 4, the floating base silicon controlled rectifier 11 comprises a first conductivity type layer 100; a second conductivity type well 200 formed in the first conductivity type layer 100; a first conductivity type heavily doped region 300 coupled to a first node A and formed in the second conductivity type well 200; and a second conductivity type heavily doped region 400 coupled to a second node B and formed in the first conductivity type layer 100. According to the embodiment of the present invention, the first conductivity type can be either P type or N type.

Figure 5A:
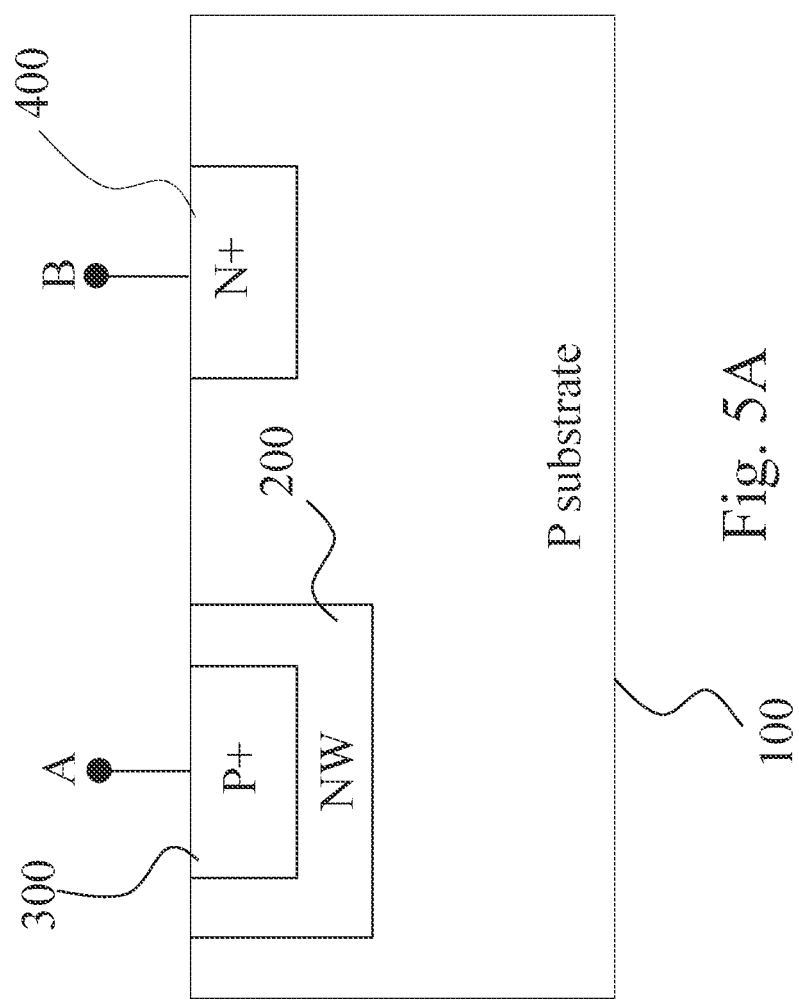
FIG. 5A shows a first preferable embodiment of the floating base silicon controlled rectifier that the first conductivity type layer is P type substrate.

FIG. 5A shows a first preferable embodiment of the floating base silicon controlled rectifier that the first conductivity type is P type, and the second conductivity type is N type. In such an embodiment, the first conductivity type layer 100 is a P type substrate, the second conductivity type well 200 is a N type well, the first conductivity type heavily doped region 300 is P+ region, and the second conductivity type heavily doped region 400 is N+ region.

Figure 5B:
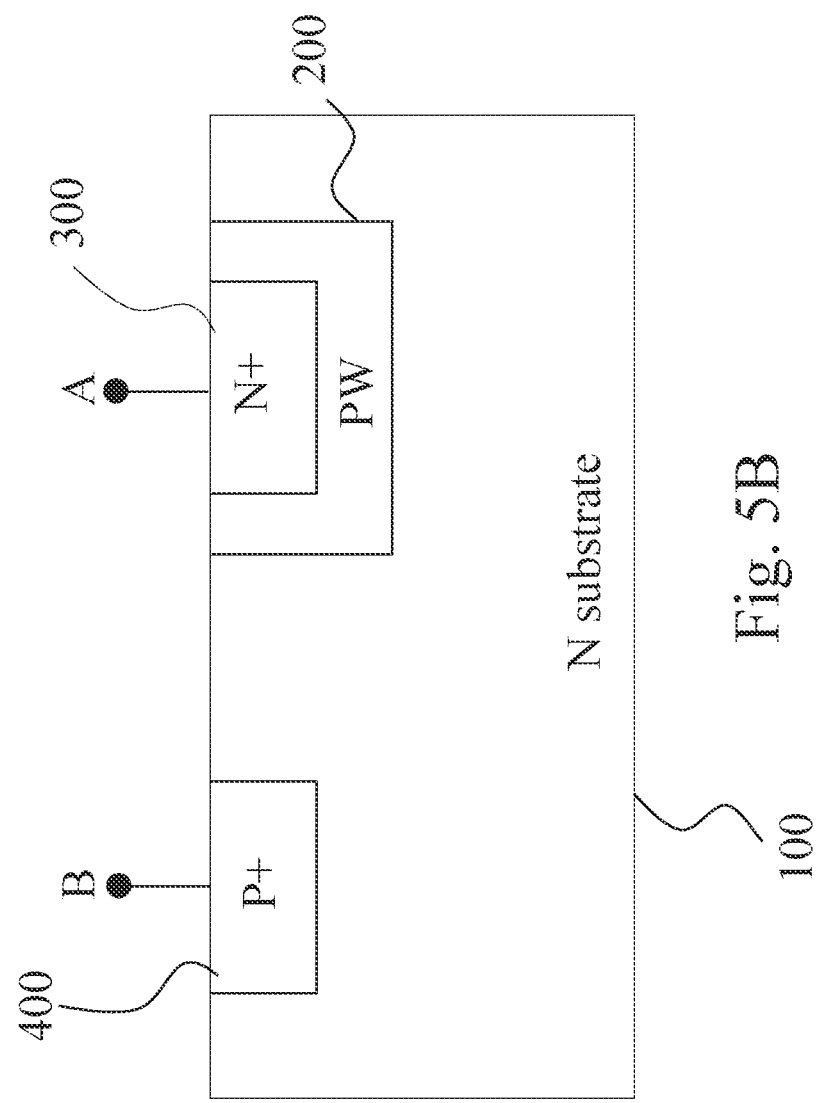
FIG. 5B shows a second preferable embodiment of the floating base silicon controlled rectifier that the first conductivity type layer is N type substrate.

On the other hand, the first conductivity type can be N type alternatively. When the first conductivity type is N type, then the second conductivity type will be P type, as shown in FIG. 5B. In such an embodiment, the first conductivity type layer 100 is a N type substrate, the second conductivity type well 200 is a P type well, the first conductivity type heavily doped region 300 is N+ region, and the second conductivity type heavily doped region 400 is P+ region.

Figure 6A:
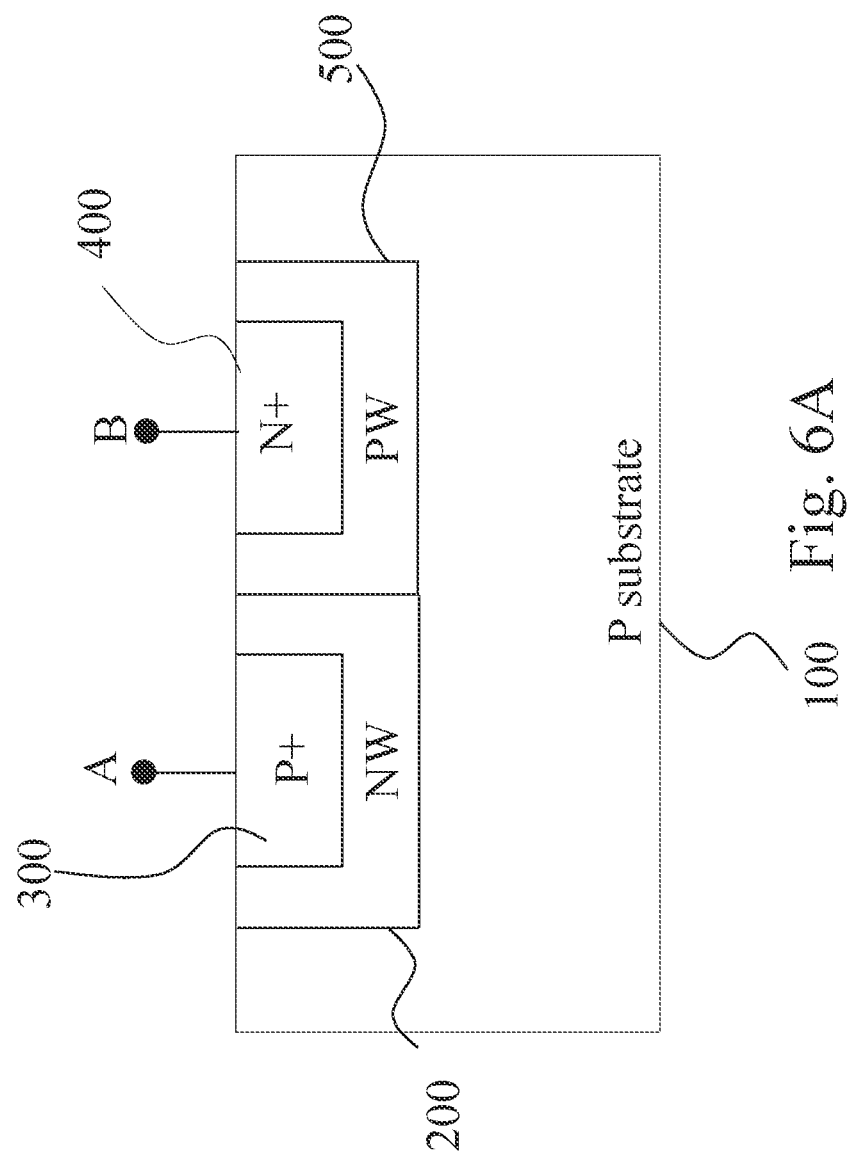
FIG. 6A shows a fourth preferable embodiment of the floating base silicon controlled rectifier according to the present invention.
Figure 6B:
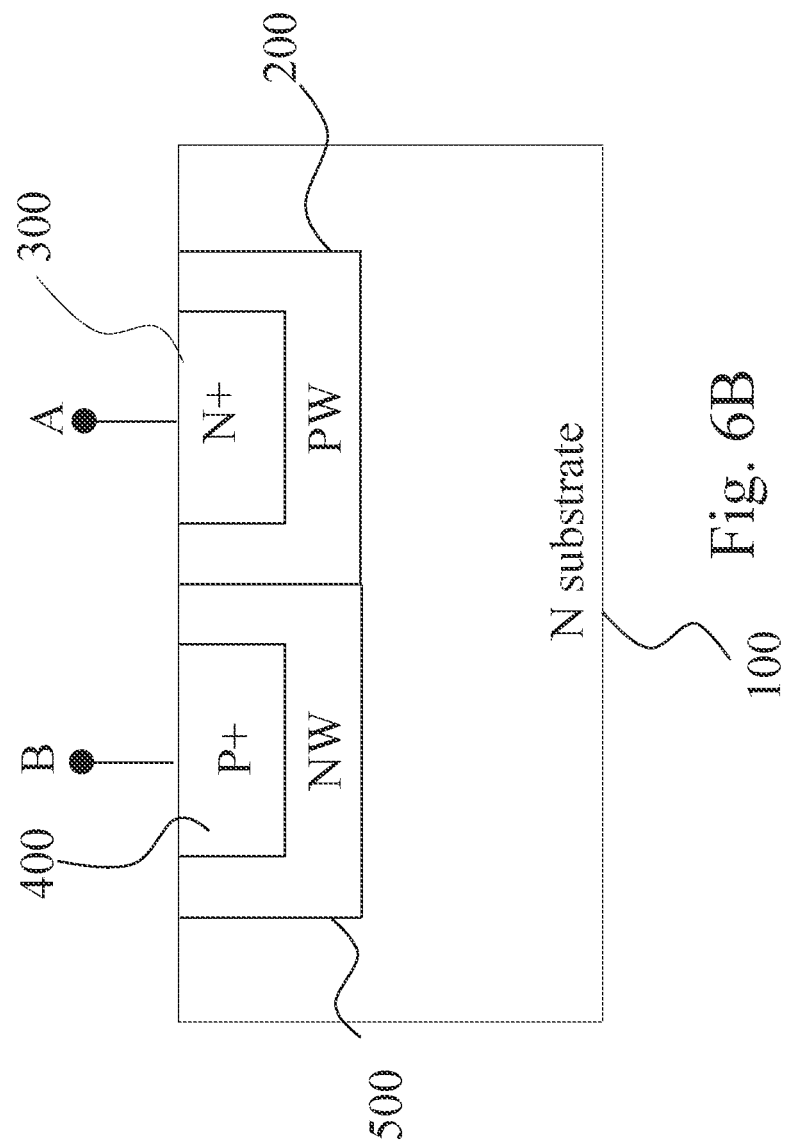
FIG. 6B shows a fifth preferable embodiment of the floating base silicon controlled rectifier according to the present invention.

Furthermore, FIG. 5C shows a third preferable embodiment of the floating base silicon controlled rectifier according to the present invention. In FIG. 5C, in addition to the first conductivity type layer 100, the second conductivity type well 200, the first conductivity type heavily doped region 300 and the second conductivity type heavily doped region 400, the floating base silicon controlled rectifier 11' further comprises a first conductivity type well 500, which is formed in the first conductivity type layer 100, and the second conductivity type heavily doped region 400 is disposed in the first conductivity type well 500. Under such conditions that the second conductivity type well 200 and the first conductivity type well 500 are both formed, then the first conductivity type layer 100 can be a P type substrate as shown in FIG. 6A or a N type substrate as shown in FIG. 6B, which can both utilized for implementing the objectives of the present invention.

Figure 7:
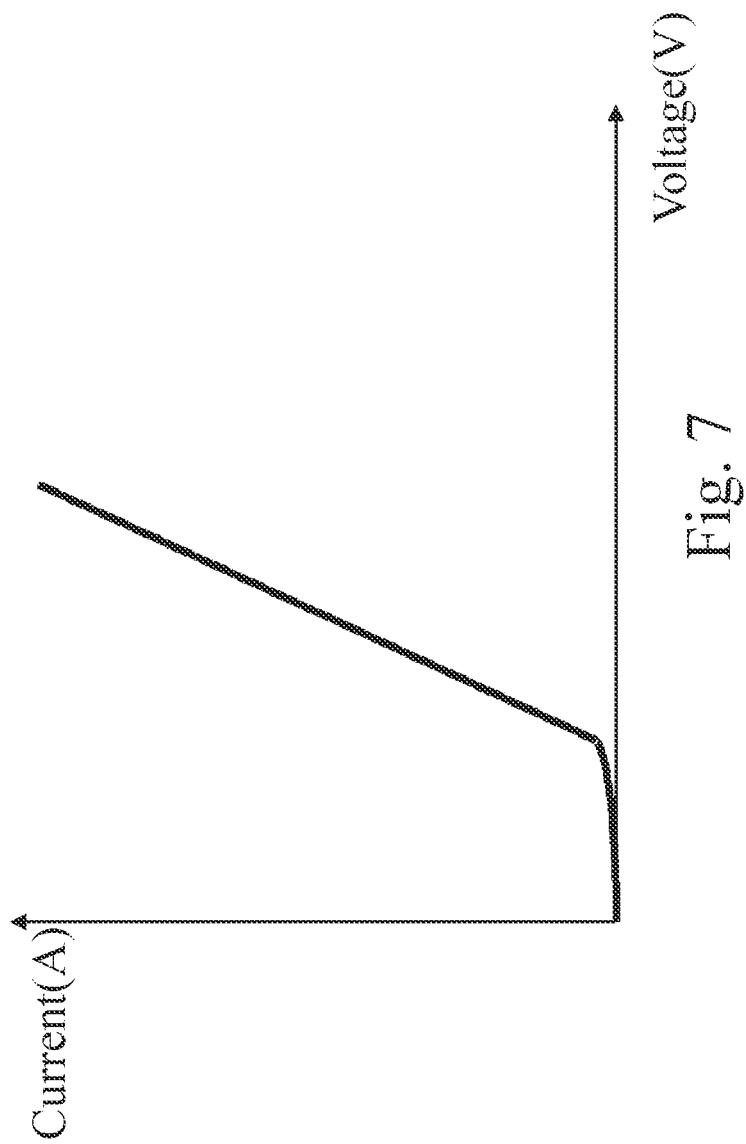
FIG. 7 shows an I-V curve of a floating base silicon controlled rectifier in accordance with embodiments of the present invention.

FIG. 7 shows an I-V curve of a floating base silicon controlled rectifier in accordance with embodiments of the present invention. Compared to FIG. 3, it is obvious that the floating base silicon controlled rectifier of the present invention acts as a forward diode, which has a small turn-on voltage approximately equals to 0.7V-1.0V. Moreover, the floating base silicon controlled rectifier of the present invention still performs low capacitance and keeps the same discharging path while greatly reducing its input capacitance.

In the above mentioned descriptions, the present invention has proposed at least four different embodiments as shown in FIG. 5A, FIG. 5B, FIG. 6A and FIG. 6B to fully explain the circuit structure of the floating base silicon controlled rectifier of the present invention in order to achieve the major objective of the present invention. In the following, we will get started with how to integrate the proposed floating base silicon controlled rectifier of the present invention into the whole-chip ESD protection design with efficient ESD clamp circuit.

Figure 8:
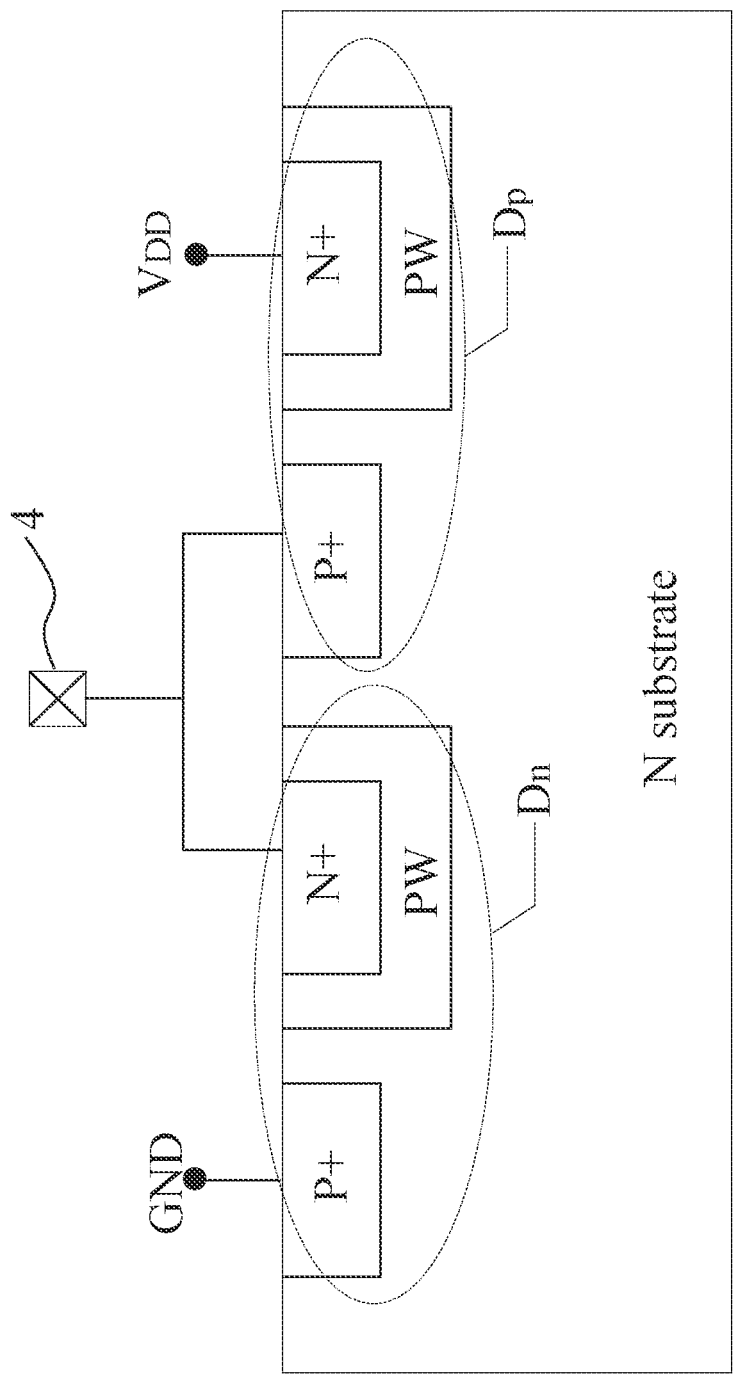
FIG. 8 shows a detailed illustration of a lateral diode structure which is applicable to whole-chip ESD protection design as shown in FIG. 1B in accordance with embodiments of the present invention.

FIG. 8 shows a detailed illustration of a lateral diode structure which is applicable to whole-chip ESD protection design as shown in FIG. 1B in accordance with embodiments of the present invention. Compared to FIG. 2, it is apparent that a modification is both applied on both $D_p$ and $D_n$. In other words, the two diodes $D_p$, $D_n$ in FIG. 8 are both replaced by the floating base silicon controlled rectifier of the present invention, in which each of the diodes $D_p$, $D_n$ behaves as a floating base silicon controlled rectifier as disclosed in FIG. 5B.

Figure 9:
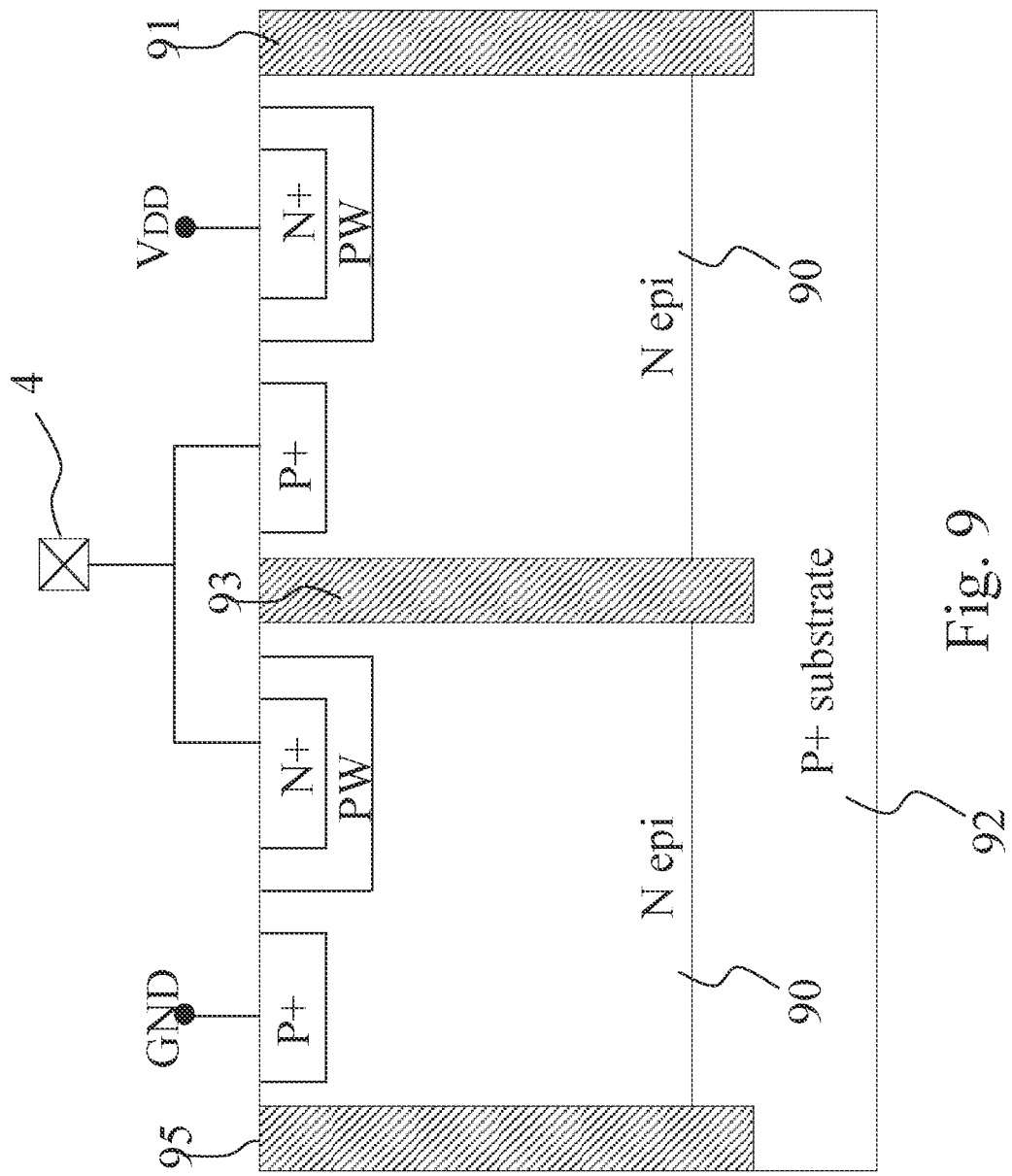
FIG. 9 shows an application structure of FIG. 8, in which the first conductivity type layer is an N type epitaxial layer.

Moreover, the scheme structure can be also implemented in the process with isolation structures, for example trenches, deep wells, SOI and etc. FIG. 9 shows an application structure of FIG. 8, in which the first conductivity type layer is an N type epitaxial layer 90 instead of a N type substrate in FIG. 8. The N type epitaxial layer 90 is further formed on a P type heavily doped substrate 92. A plurality of trenches 91, 93, 95 are arranged in the P type heavily doped substrate 92 and each of the trenches 91, 93, 95 has a depth not less than that of the N type epitaxial layer 90 for electrical isolation.

Figure 10:
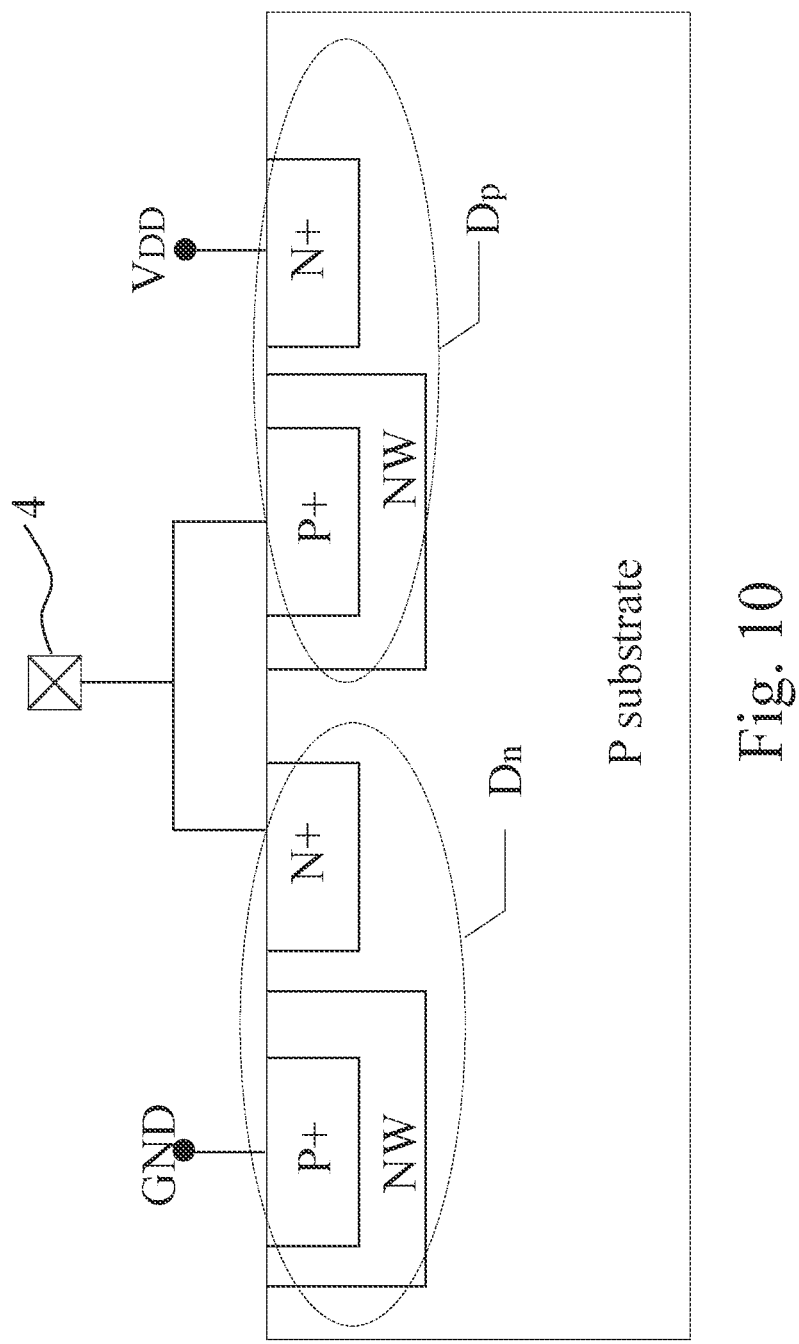
FIG. 10 shows another detailed illustration of a lateral diode structure which is applicable to whole-chip ESD protection design as shown in FIG. 1B in accordance with embodiments of the present invention.

Similarly, FIG. 10 shows another detailed illustration of a lateral diode structure which is applicable to whole-chip ESD protection design as shown in FIG. 1B in accordance with embodiments of the present invention. While compared to FIG. 2, it is apparent that a modification is both applied on both $D_p$ and $D_n$. In other words, the two diodes $D_p$, $D_n$ in FIG. 10 are both replaced by the floating base silicon controlled rectifier of the present invention, in which each of the diodes $D_p$, $D_n$ behaves as a floating base silicon controlled rectifier as disclosed in FIG. 5A.

Figure 11:
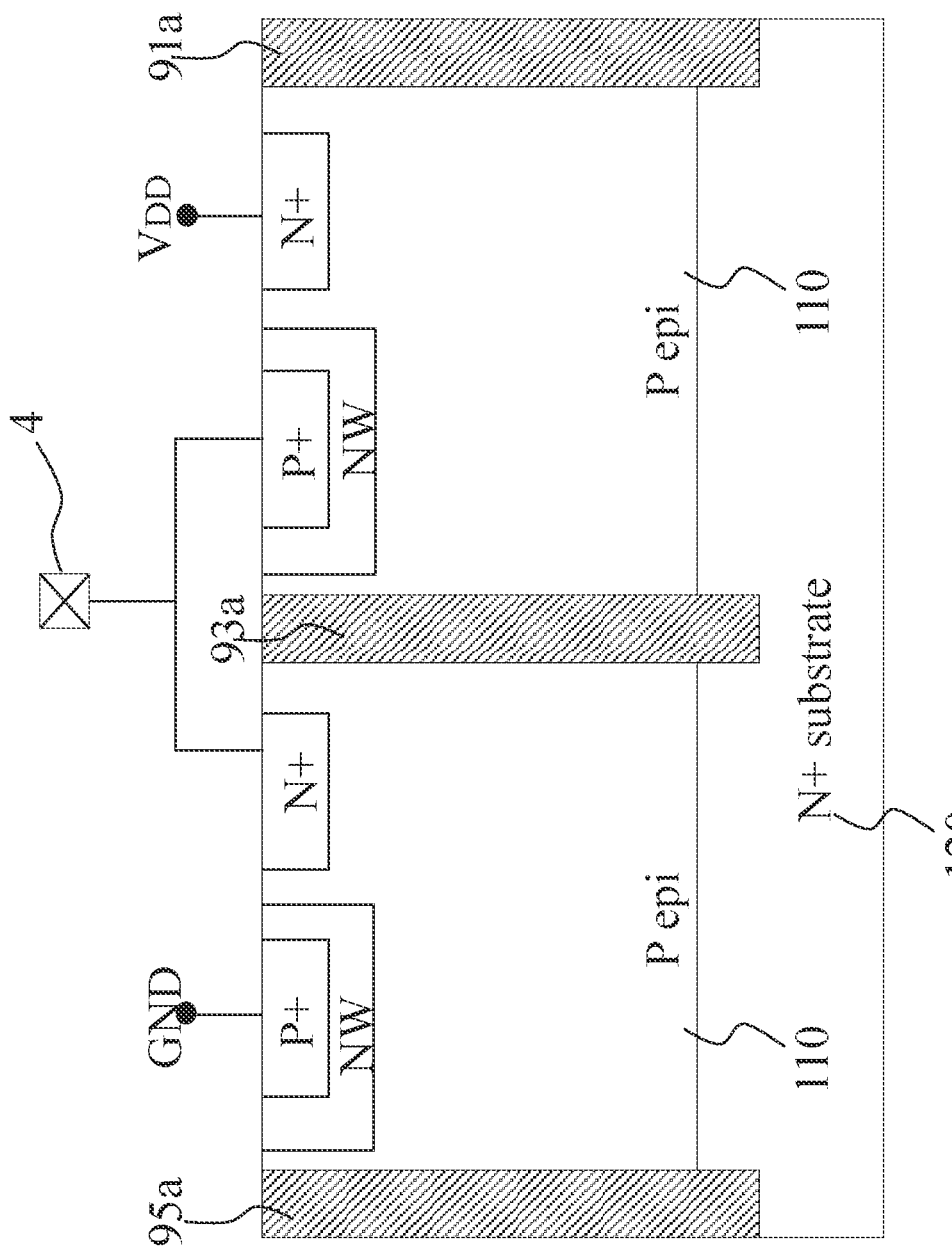
FIG. 11 shows an application structure of FIG. 10, in which the first conductivity type layer is a P type epitaxial layer.

In the same manners, the scheme structure can be also implemented in the process with isolation structures, for example trenches, deep wells, SOI and etc. FIG. 11 shows an application structure of FIG. 10, in which the first conductivity type layer is a P type epitaxial layer 110 instead of a P type substrate in FIG. 10. The P type epitaxial layer 110 is further formed on an N type heavily doped substrate 120. A plurality of trenches 91a, 93a, 95a are arranged in the N type heavily doped substrate 120 and each of the trenches 91a, 93a, 95a has a depth not less than that of the P type epitaxial layer 110 for electrical isolation.

According to the present invention, the embodiments we have described in FIGS. 8, 9, 10 and 11 are embodiments that both of the two diodes $D_p$, $D_n$ are replaced by the floating base silicon controlled rectifier of the present invention. However, it is worth noticing that the present invention is not limited thereto. The floating base silicon controlled rectifier of the present invention can be utilized for alternatively replacing either one of the diodes $D_p$, $D_n$ or both of the diodes $D_p$, $D_n$ when being applied to a whole-chip ESD protection design having circuit structure as shown FIG. 1B. Any modifications and variations can be made to the present invention without departing from the scope or spirit of the invention, while still falling within the scope of the present invention.

As a result, to sum up, the present invention certainly provides a novel and inventive floating base silicon controlled rectifier which has never been seen or proposed ever before. The proposed invention employs the floating base silicon controlled rectifier which acts like a forward diode and turns on at a smaller voltage value approximately 0.7-1.0V. When applied to a whole-chip ESD protection design with efficient $V_{DD}$-to-$V_{ss}$ ESD clamp circuit for submicron CMOS VLSI technology, the conventional lateral diode structure may be further modified based on the proposed floating base silicon controlled rectifier. For example, replacing any one of the diodes $D_p$, $D_n$ or both of them are applicable.

Furthermore, as compared to the prior design, an input capacitance of the circuit structure can be successfully decreased, whereby performing low capacitance. And, the novel scheme structure of the present invention can be also implemented in the process with isolation structures, for example trenches, deep wells, SOI and etc. in a variety of technical fields. As a result, the Applicants assert that the present invention is instinct, effective and highly competitive for incoming technology, industries and researches developed in the future and shall be patentable soon as well.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:
1. A whole-chip ESD protection structure, comprising:
  a first and second floating base silicon controlled rectifier each comprising:
    a first conductivity type layer;
    a second conductivity type well formed in said first conductivity type layer, said second conductivity type being different from said first conductivity type;

a first conductivity type heavily doped region formed in said second conductivity type well and coupled to a first node, wherein the first node is the only node coupled within the second conductive type well; and a second conductivity type heavily doped region formed in said first conductivity type layer and coupled to a second node, such that said first conductivity type layer, said second conductivity type well, said first conductivity type heavily doped region and said second conductivity type heavily doped region forms said floating base silicon controlled rectifier;

wherein an anode of said first floating base silicon controlled rectifier is electrically connected to a low voltage level, a cathode of said first floating base silicon controlled rectifier and an anode of said second floating base silicon controlled rectifier are electrically connected to an I/O pin, a cathode of said second floating base silicon controlled rectifier is electrically connected to a high voltage level, and said first and second floating base silicon controlled rectifiers are capable of acting as a forward biased diode, said first and second floating base silicon controlled rectifiers have a small turn-on voltage in a range of 0.7 V-1.0 V, said first and second floating base silicon controlled rectifiers show no snapback effect and the first conductivity type layer is an epitaxial layer.

2. The whole-chip ESD protection structure according to claim 1, wherein said second conductivity type is P type, if said first conductivity type is N type.

3. The whole-chip ESD protection structure according to claim 2, wherein said first conductivity type layer is a N type epitaxial layer, and said N type epitaxial layer is further formed on a P type heavily doped substrate.

4. The whole-chip ESD protection structure according to claim 3, further comprising a plurality of trenches arranged in said P type heavily doped substrate, wherein each of said trenches has a depth not less than that of said N type epitaxial layer for electrical isolation.

* * * * *